(12) United States Patent
Homma (10) Patent No.: US 7,962,875 B2
(45) Date of Patent: Jun. 14, 2011

(54) METHOD, APPARATUS AND PROGRAM FOR DESIGNING CIRCUITS

(75) Inventor: Yuya Homma, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 326 days.

(21) Appl. No.: 12/255,363

(22) Filed: Oct. 21, 2008

(65) Prior Publication Data

US 2009/0138839 A1    May 28, 2009

(30) Foreign Application Priority Data

Nov. 27, 2007 (JP) ................................ 2007-305752

(51) Int. Cl.
*G06F 17/50* (2006.01)
(52) U.S. Cl. ......... 716/113; 716/119; 716/126; 716/134
(58) Field of Classification Search .................. 716/113, 716/119, 126, 134
See application file for complete search history.

(56) References Cited

U.S. PATENT DOCUMENTS

| | | | | |
|---|---|---|---|---|
| 5,452,239 | A * | 9/1995 | Dai et al. ......................... | 703/19 |
| 6,321,366 | B1 * | 11/2001 | Tseng et al. ..................... | 716/6 |
| 6,615,392 | B1 * | 9/2003 | Nadeau-Dostie et al. ........ | 716/5 |
| 6,785,873 | B1 * | 8/2004 | Tseng ............................... | 716/4 |
| 6,959,426 | B2 * | 10/2005 | Xiang et al. ..................... | 716/3 |
| 6,978,429 | B2 | 12/2005 | Yoshida et al. | |
| 7,185,295 | B2 * | 2/2007 | Park et al. ......................... | 716/4 |
| 7,299,433 | B2 * | 11/2007 | Clement et al. .................... | 716/6 |
| 7,478,349 | B2 * | 1/2009 | Hayles et al. ..................... | 716/6 |
| 7,610,569 | B2 * | 10/2009 | Park .................................. | 716/5 |
| 7,653,849 | B1 * | 1/2010 | Tabatabaei ..................... | 714/726 |
| 7,770,139 | B2 * | 8/2010 | Arsovski et al. .................. | 716/1 |
| 2002/0152060 | A1 * | 10/2002 | Tseng ............................. | 703/17 |
| 2003/0171908 | A1 * | 9/2003 | Schilp et al. ..................... | 703/16 |
| 2004/0153978 | A1 * | 8/2004 | Xiang et al. ..................... | 716/3 |
| 2004/0250224 | A1 * | 12/2004 | Clement et al. ................... | 716/6 |
| 2005/0149895 | A1 * | 7/2005 | Toubou ............................ | 716/6 |
| 2005/0216247 | A1 | 9/2005 | Ikeda et al. | |
| 2006/0117274 | A1 * | 6/2006 | Tseng et al. ....................... | 716/1 |
| 2006/0253823 | A1 * | 11/2006 | Matsumura et al. .............. | 716/6 |
| 2007/0113209 | A1 * | 5/2007 | Park et al. ........................ | 716/4 |
| 2007/0180413 | A1 * | 8/2007 | Park ................................ | 716/5 |
| 2009/0177445 | A1 * | 7/2009 | Capps et al. ..................... | 703/1 |

FOREIGN PATENT DOCUMENTS

JP        2006-085595        3/2006

* cited by examiner

*Primary Examiner* — Phallaka Kik
(74) *Attorney, Agent, or Firm* — Turocy & Watson, LLP (57) ABSTRACT

A circuit designing method for a semiconductor integrated circuit, the circuit having a clock control circuit and leaves to which clock signals are propagated through the clock control circuit, has detecting a clock signal producing point where a clock signal is to be produced and an operational mode setting point where an operational mode setting signal for setting an operational mode is to be imparted, using a netlist and a cell library, setting a clock signal and a name of the clock signal at the clock signal producing point, setting an operational mode setting signal suitable for a desired operational mode at the operational mode setting point, propagating the clock signal and the operational mode setting signal, and extracting signals being propagated to the leaves.

20 Claims, 7 Drawing Sheets

PROPAGATION CLOCK TABLE

| LEAF NAME | MODE 1 | MODE 2 |
|---|---|---|
| FF1 | CLK1 | CLK2 |
| FF2 | CLK1 | CLK2 |
| FF3 | CLK1 | CLK2 |
| FF4 | 0 | CLK2 |
| FF5 | 0 | CLK2 |
| FF6 | ~CLK1 | 0 |

FIG. 3

CLOCK SELECT LOGIC TABLE

| LEAF NAME | MODE 1 | MODE 2 |
|---|---|---|
| FF1,FF2,FF3 | CLK1 | CLK2 |
| FF4,FF5 | 0 | CLK2 |
| FF6 | ~CLK1 | 0 |

METHOD, APPARATUS AND PROGRAM FOR DESIGNING CIRCUITS

CROSS REFERENCE TO RELATED APPLICATION

This application is based upon and claims benefit of priority from the Japanese Patent Application No. 2007-305752, filed on Nov. 27, 2007, the entire contents of which are incorporated herein by reference.

BACKGROUND OF THE INVENTION

1. Field of the Invention

The present invention relates to a method, apparatus and program for designing circuits.

2. Related Art

Designing semiconductor integrated circuits includes a plurality of steps, such as designing IP (intellectual property) blocks, assembling the blocks, inserting a test circuit, producing a netlist (logic cell connecting information), and creating a layout. At the step of creating a layout, information (such as on asynchronous relationship for dividing a clock tree so that no portions would be duplicated, and on leaves other than flip flops) required for CTS (clock tree synthesis) is extracted, for example, based on clock information. (See, for example, Japanese Patent Laid-Open No. 2006-85595).

Recently, system LSIs (large scale integrated circuits) tend to have a complicated clock control circuit (circuit covering from a point where clocks are produced, up to leaves, such as flip flops and memories, where the clocks are supplied) because of the increase in the number of clock systems accompanying the scaling up of the LSIs and addition of multiple functions to the LSIs, and also because of the division of design labor between blocks and operational modes.

For this reason, it takes considerable time to analyze the circuit structure of such a clock control circuit and prepare its clock system diagram, and then to carry out logic extraction of the clock control circuit, which has led to prolonging the period required for circuit designing.

In addition, a difficulty has arisen in grasping the functions of an entire clock control circuit, including clocks that propagate in respective operational modes. This has caused another difficulty in the optimization of a clock control circuit carried out prior to the step of creating a layout, the optimization including reduction of a chip area or reduction of the clock latency by the reduction of redundant circuits.

SUMMARY OF THE INVENTION

According to one aspect of the present invention, there is provided a circuit designing method for a semiconductor integrated circuit, the circuit having a clock control circuit and leaves to which clock signals are propagated through the clock control circuit, comprising:

detecting a clock signal producing point where a clock signal is to be produced and an operational mode setting point where an operational mode setting signal for setting an operational mode is to be imparted, using a netlist and a cell library;

setting a clock signal and a name of the clock signal at the clock signal producing point;

setting an operational mode setting signal suitable for a desired operational mode at the operational mode setting point;

propagating the clock signal and the operational mode setting signal; and extracting signals being propagated to the leaves.

According to one aspect of the present invention, there is provided a circuit designing apparatus for a semiconductor integrated circuit, the circuit having a clock control circuit and leaves to which clock signals are propagated through the clock control circuit, comprising:

a data inputting section configured to be imparted with a netlist and a cell library;

a clock/operational mode setting section configured to: detect a clock signal producing point where a clock signal is to be produced and an operational mode setting point where an operational mode setting signal for setting an operational mode is to be imparted, using the netlist and the cell library; set a clock signal and a name of the clock signal at the clock signal producing point; and set an operational mode setting signal suitable for a desired operational mode at the operational mode setting point;

a clock propagation executing section configured to propagate the clock signal and the operational mode setting signal; and a propagated clock extracting section configured to extract signals being propagated to the leaves.

According to one aspect of the present invention, there is provided a program for allowing a computer to execute designing of a semiconductor integrated circuit, the circuit having a clock control circuit and leaves to which clock signals are propagated through the clock control circuit, the program allowing the computer to execute:

detecting a clock signal producing point where a clock signal is to be produced and an operational mode setting point where an operational mode setting signal for setting an operational mode is to be imparted, using a netlist and a cell library;

setting a clock signal and a name of the clock signal at the clock signal producing point;

setting an operational mode setting signal suitable for a desired operational mode at the operational mode setting point;

propagating the clock signal and the operational mode setting signal; and extracting signals being propagated to the leaves.

DESCRIPTION OF THE EMBODIMENTS

With reference to the accompanying drawings, hereinafter will be described some embodiments of the present invention.

First Embodiment

Figure 1:
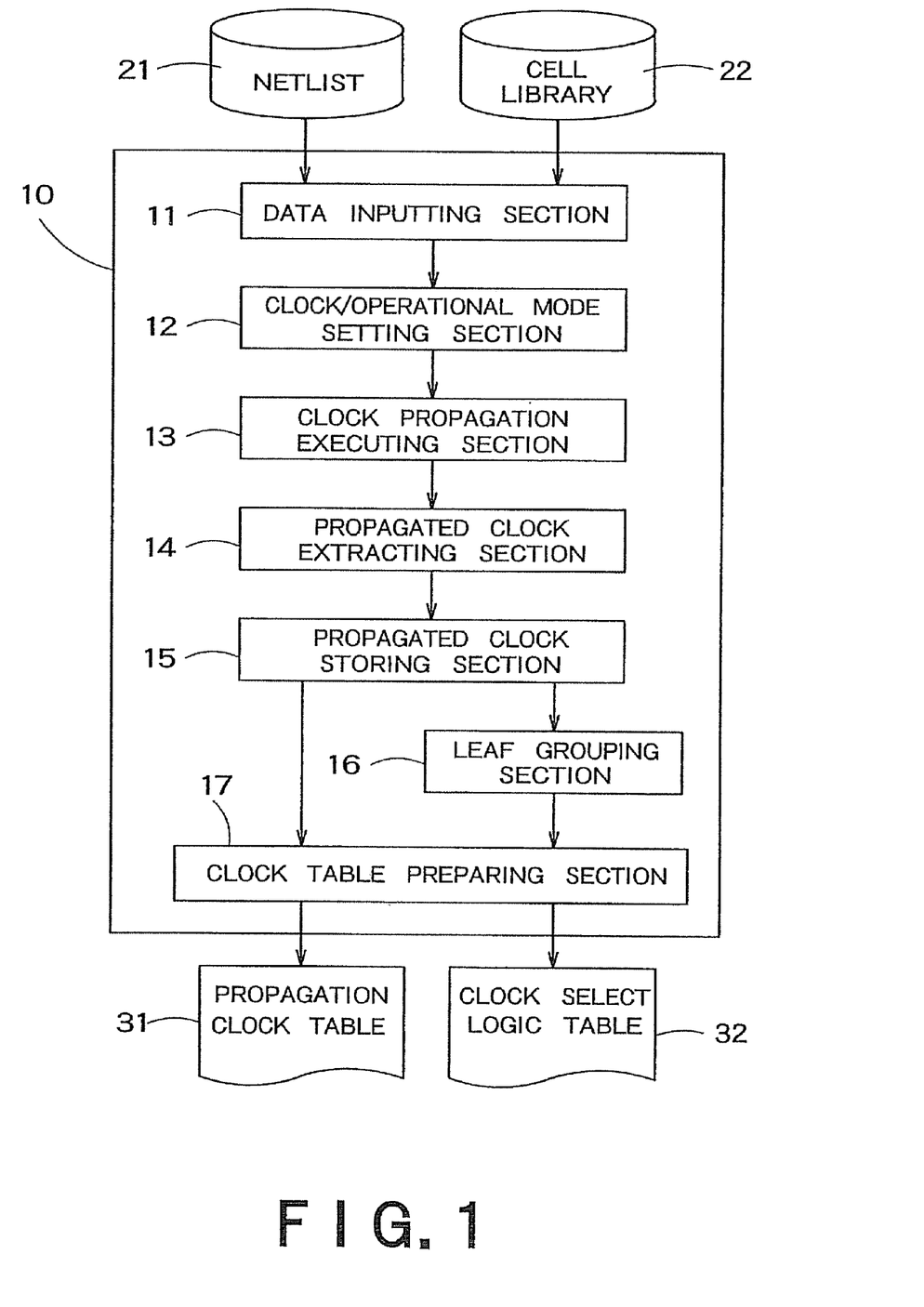
FIG. 1 is a schematic diagram illustrating a designing apparatus for a semiconductor integrated circuit, according to a first embodiment of the present invention.

FIG. 1 is a schematic diagram illustrating a designing apparatus for a semiconductor integrated circuit, according to a first embodiment of the present invention. A designing apparatus 10 is provided with a netlist 21 and a cell library 22, and produces and outputs a propagation clock table 31 and a clock select logic table 32. The netlist 21 stores design information associated with cells and a connecting relationship between wires. The cell library 22 stores design information (logic information) associated with cells. Explanation on the propagation clock table 31 and the clock select logic table 32 will be provided later.

The designing apparatus 10 includes a data inputting section 11, clock/operational mode setting section 12, clock propagation executing section 13, propagated clock extracting section 14, propagated clock storing section 15, leaf grouping section 16 and clock table preparing section 17.

The data inputting section 11 receives the netlist 21 and the cell library 22.

The clock/operational mode setting section 12 detects a point where a clock signal (or constant) is produced, based on the netlist 21 and sets a clock (or constant) and the name of the clock at the point. The clock/operational mode setting section 12 also detects a point for setting an operational mode selecting signal and sets a value corresponding to each operational mode at the setting point.

The clock propagation executing section 13 propagates the clock signal and the operational mode selecting signal set by the clock/operational mode setting section 12.

The propagated clock extracting section 14 extracts clocks (or constants) propagated to leaves, such as flip flops or memories. The propagated clock extracting section 14 extracts clocks propagated to each of the leaves for every operational mode and stores the clocks in the propagated clock storing section 15.

Figure 2:
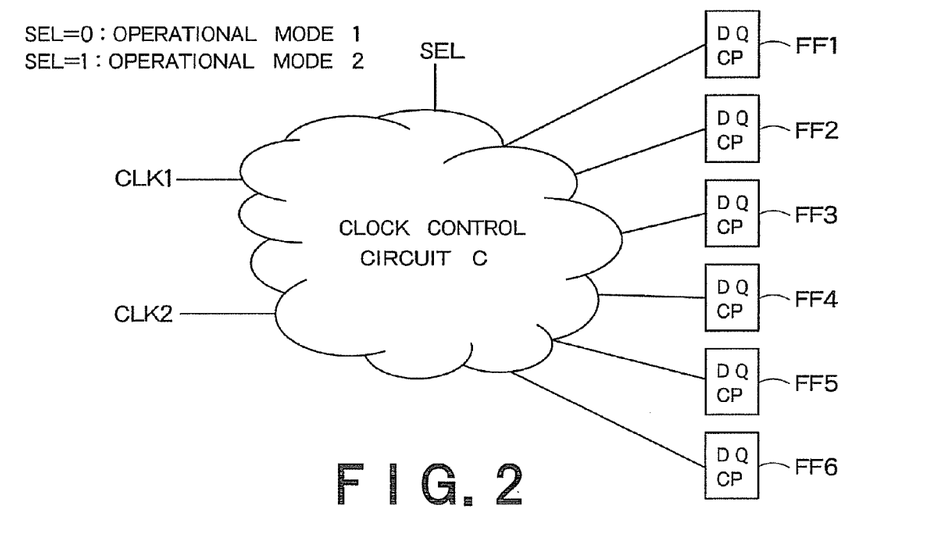
FIG. 2 illustrates flip flops to which clock signals are propagated.

For example, as shown in FIG. 2, the propagated clock extracting section 14 extracts the clocks that are propagated to flip flops FF1 to FF6. The flip flops FF1 to FF6 are imparted with a clock signal CLK1, CLK2 or a constant (e.g. in the case of being gated) through a clock control circuit C.

The clock control circuit C is imparted with an operational mode selecting signal SEL. When the operational mode selecting signal SEL is "0", an operational mode "1" is effected, and when the operational mode selecting signal SEL is "1", an operational mode "2" is effected.

The leaf grouping section 16 uses the propagated clocks for the leaves stored in the propagated clock storing section 15 and groups the leaves together, to which the same clocks (or constants) are to be propagated.

The clock table preparing section 17 uses the propagated clocks for each of the leaves stored in the propagated clock storing section 15, and prepares and outputs the propagation clock table 31 which indicates the clocks (or constants) to be propagated to the respective leaves by operational mode.

Figure 3:
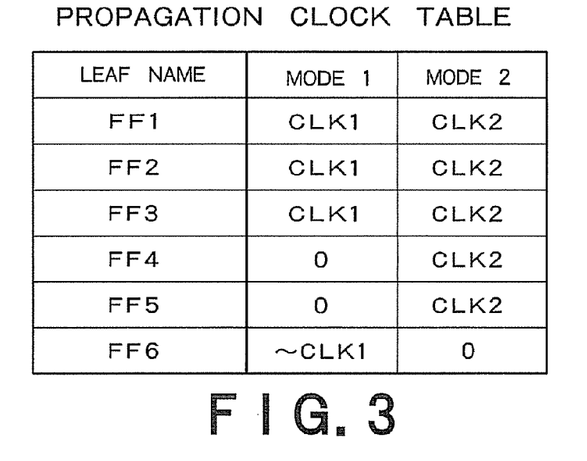
FIG. 3 illustrates an example of a propagation clock table.

FIG. 3 illustrates an example of the propagation clock table 31 with the clocks extracted from the circuit illustrated in FIG. 2. In order to distinguish between inverse clocks and normal (non-inverse) clocks, each inverse clock is indicated with a mark "~" at its clock name.

The clock table preparing section 17 uses the results of the grouping performed by the leaf grouping section 16, and prepares and outputs the clock select logic table 32 in which the leaves of the same select logic are grouped together.

Figure 4:
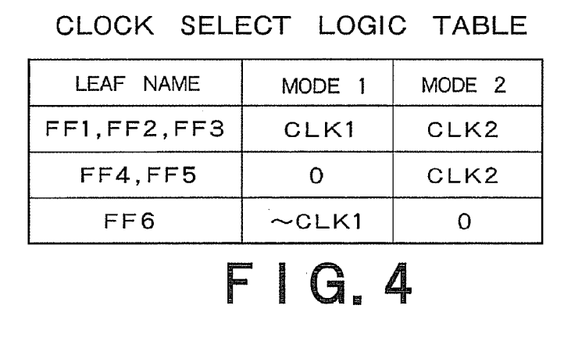
FIG. 4 illustrates an example of a clock select logic table.

FIG. 4 illustrates the clock select logic table 32 in the case where the clocks propagated to the respective leaves are those illustrated in FIG. 3. The flip flops FF1 to FF3 are grouped together because the same clocks are propagated when the operational mode is "1" and "2". Similarly, the flip flops FF4 and FF5 are grouped together.

In this way, the designing apparatus 10 of the present embodiment is able to carry out logic extraction for the clock control circuit in a short time by detecting, for every operational mode, the clocks propagated to the leaves, without analyzing the circuit structure of the clock control circuit.

Figure 5:
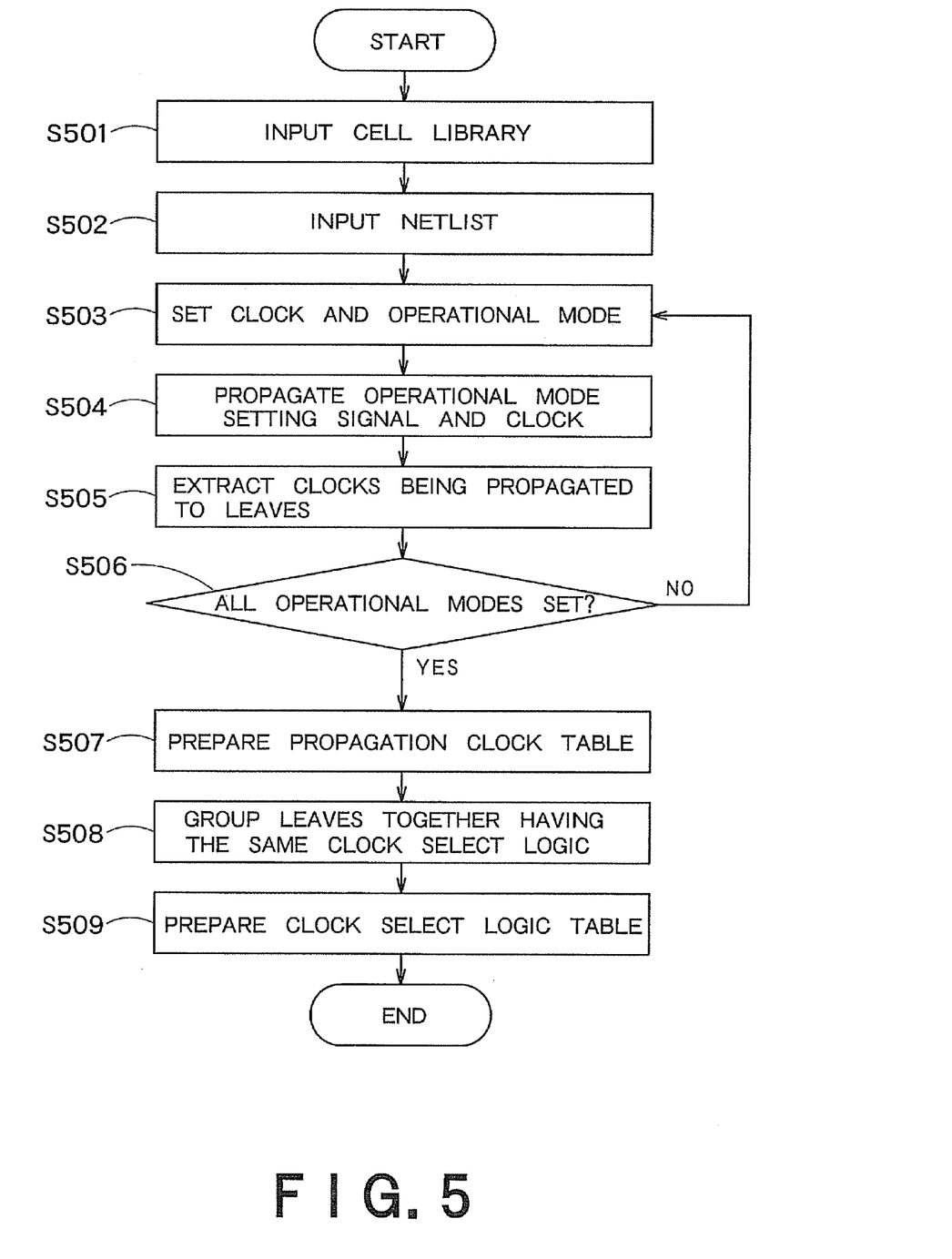
FIG. 5 is a flow diagram illustrating a logic extracting method for the clock control circuit according to the first embodiment.

Referring now to a flow diagram illustrated in FIG. 5, hereinafter is explained a logic extracting procedure for the clock control circuit performed by the designing apparatus 10.

(Step S501) A cell library is inputted.
(Step S502) A netlist is inputted.
(Step S503) A clock (or constant) and the name of the clock are set at a point where a clock signal is to be produced. Also, a value is set, which value corresponds to each of operational modes yet to be set to an operational mode selecting signal.
(Step S504) Clock signals and operational mode selecting signals are propagated.
(Step S505) Clock signals propagated to each of the leaves are extracted.
(Step S506) It is determined whether or not the operational mode selecting signals have been set with the values associated with all of the operational modes. If the determination is affirmative, control proceeds to step S507, and if negative, control returns to step S503.
(Step S507) A propagation clock table is prepared.
(Step S508) Those leaves having the same clock select logic are grouped together.
(Step S509) A clock select logic table is prepared.

In this way, the clocks to be propagated to each leaf (goal of clocks) are extracted without the analysis of the circuit structure of the clock control circuit. As a result, logic information of the clock control circuit can be extracted in a short time. Also, the functions of the clock control circuit can be readily grasped using the propagation clock table and the clock select logic table. In addition, the user (circuit designer) can reconfigure the clock control circuit, referring to the propagation clock table and the clock select logic table to provide a simplified circuit structure.

Second Embodiment

Figure 6:
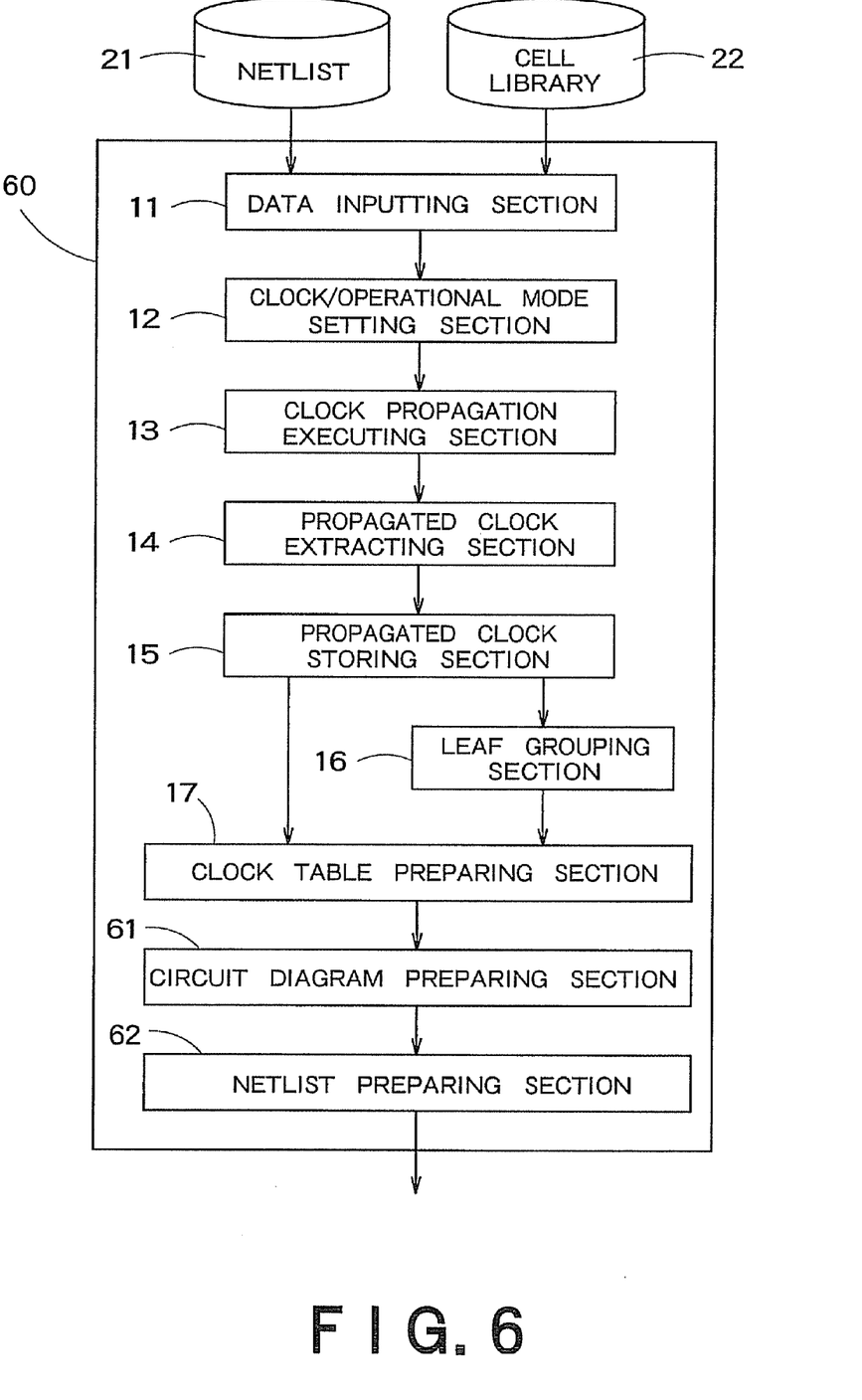
FIG. 6 is a schematic diagram illustrating a designing apparatus for a semiconductor integrated circuit, according to a second embodiment of the present invention.

FIG. 6 is a schematic diagram illustrating a designing apparatus for a semiconductor integrated circuit, according to a second embodiment of the present invention. A designing apparatus 60 includes a data inputting section 11, clock/operational mode setting section 12, clock propagation executing section 13, propagated clock extracting section 14, propagated clock storing section 15, leaf grouping section 16, clock table preparing section 17, circuit diagram preparing section 61 and netlist preparing section 62.

An explanation on the functions is omitted for the data inputting section 11, clock/operational mode setting section 12, clock propagation executing section 13, propagated clock extracting section 14, propagated clock storing section 15, leaf grouping section 16 and clock table preparing section 17, because these components have the functions similar to those in the first embodiment.

The circuit diagram preparing section 61 uses the clock select logic table outputted from the clock table preparing section 17 to prepare a circuit diagram for the clock control circuit. To this end, the circuit diagram preparing section 61 first refers to the clock select logic table to detect the presence of the leaves to which inverse clocks are to be propagated. If there is any leaf to which an inverse clock is to be propagated, an inverter is mapped.

Then, for each of the groups, the circuit diagram preparing section 61 maps a multiplexer, using the clock select logic table. The multiplexer uses an operational mode setting signal as a selection signal, and selects and outputs a clock signal (or constant) according to the operational mode.

Figure 7:
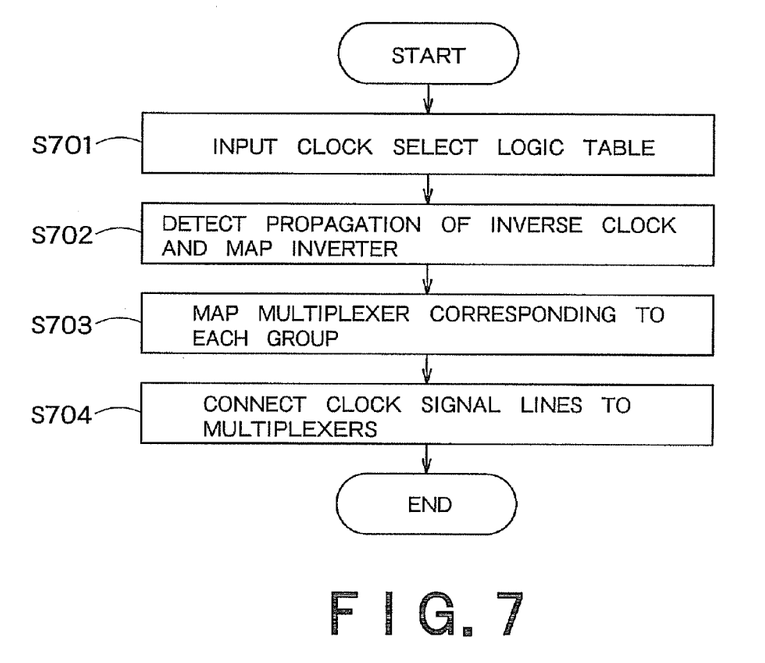
FIG. 7 is a flow diagram illustrating a circuit diagram preparing method for the clock control circuit according to the second embodiment.

Referring to a flow diagram illustrated in FIG. 7, hereinafter is explained a circuit diagram preparing procedure performed by the circuit diagram preparing section 61. As an example of a clock select logic table, the one illustrated in FIG. 4 is used here.

(Step S701) A clock select logic table is inputted.

(Step S702) With reference to the clock select logic table, it is detected whether or not inverse clocks have been propagated. If the propagation of an inverse clock is detected, an inverter is mapped.

For example, from the clock select logic table illustrated in FIG. 4, it is understood that an inverse clock has been propagated to the group consisting of the flip flop FF6. In this case, one inverter is mapped.

Figure 8:
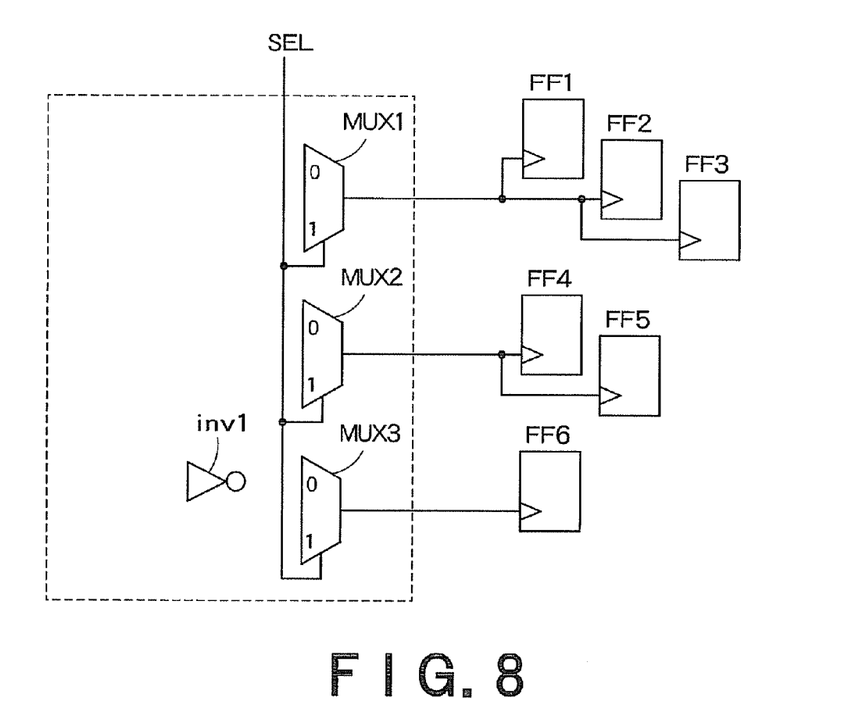
FIG. 8 illustrates an example of mapping multiplexers in preparing a circuit diagram of a modified clock control circuit.

(Step S703) A multiplexer is mapped, which is suitable for each group and uses an operational mode setting signal as a selection signal. As shown in FIG. 8, a multiplexer MUX1 is mapped for the group of the flip flops FF1 to FF3, a multiplexer MUX2 is mapped for a group of flip flops FF4 and FF5, and a multiplexer MUX3 is mapped for the flip flop FF6. An inverter inv1 is the one mapped at step S702.

A connection is established so that a selection signal input terminal of each of the multiplexers MUX1 to MUX3 can be imparted with an operational mode setting signal as the selection signal SEL.

(Step S704) A connection is established so that a clock signal for performing selection/output can be supplied to each of the multiplexers. In the case where a constant "0" or "1" is to be propagated such as by gating, the constant is inputted.

Figure 9:
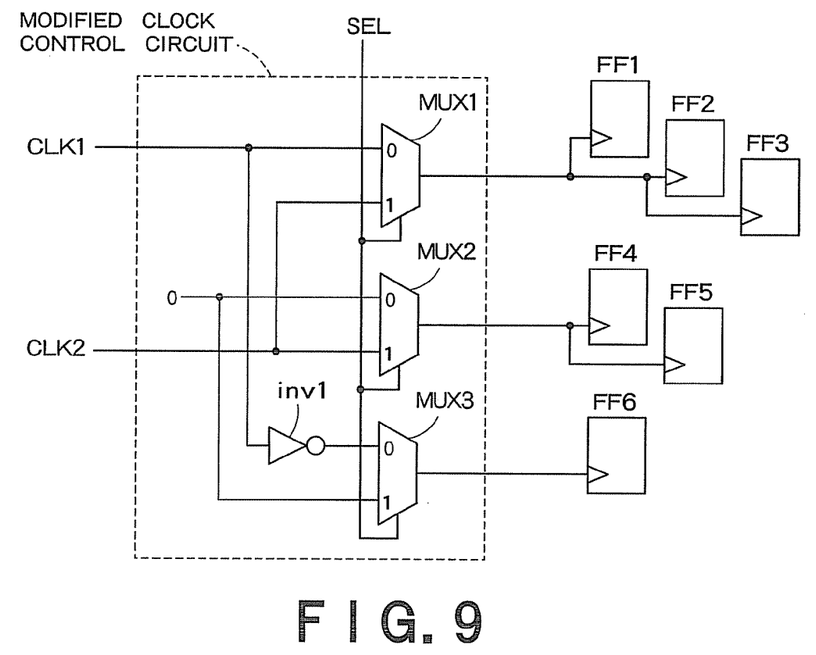
FIG. 9 illustrates an example of connecting clock signal lines in preparing a circuit diagram of a modified clock control circuit.

For example, as shown in FIG. 9, the clock signals CLK1 and CLK2 are inputted to the multiplexer MUX1. The constant "0" and the clock signal CLK2 are inputted to the multiplexer MUX2. Also, the clock signal CLK1 passing through the inverter inv1 and the constant "0" are inputted to the multiplexer MUX3.

Assuming that the operational mode 1 is effected with the selection signal SEL inputted to the multiplexers MUX1 to MUX3 being "0", and that the operational mode 2 is effected with the selection signal SEL being "1", a modified clock control circuit can be realized, whose logic is equivalent to that of the clock control circuit representing the clock select logic table illustrated in FIG. 4.

The netlist preparing section 62 outputs the modified clock control circuit that has been prepared by the circuit diagram preparing section 61, in the form of a netlist described in an HDL (hardware description language). The netlist may be of an RTL (register transfer level) or of a gate level.

In this way, the designing apparatus of the present embodiment is able to prepare a clock control circuit in a short time, which can be readily debugged by using the clock select logic table.

In addition, the clock control circuit can be optimized by replacing each of the clock control circuits defined by the netlists (netlists 21 in FIGS. 1 and 6) inputted by the designing apparatus, with the modified clock control circuit prepared in the above embodiment.

Figure 10:
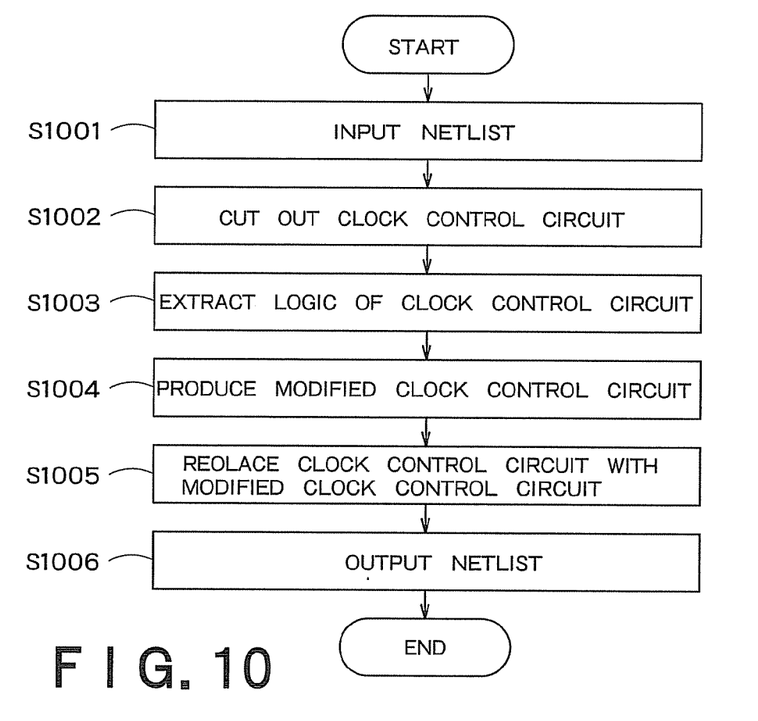
FIG. 10 is a flow diagram illustrating a circuit designing method for optimizing a clock control circuit.

Referring to a flow diagram illustrated in FIG. 10, hereinafter is explained a circuit designing method for optimizing such a clock control circuit.

(Step S1001) A netlist and a cell library before the optimization of the clock control circuit are inputted.

(Step S1002) The clock control circuit scattering within the circuit is brought together and cut out from the netlist.

(Step S1003) Logic extraction is carried out for the clock control circuit to prepare a clock select logic table. The logic extraction is carried out in the same manner as in the first embodiment (the flow diagram illustrated in FIG. 5) described above.

(Step S1004) The clock select logic table is used to prepare a modified clock control circuit. The preparation of the clock control circuit is carried out in the same manner as in the second embodiment (the flow diagram illustrated in FIG. 7) described above.

(Step S1005) The clock control circuit cut out at step S1002 is replaced by the modified clock control circuit prepared at step S1004.

(Step S1006) A netlist of the entire circuit including the modified clock control circuit is prepared and outputted.

Figure 11:
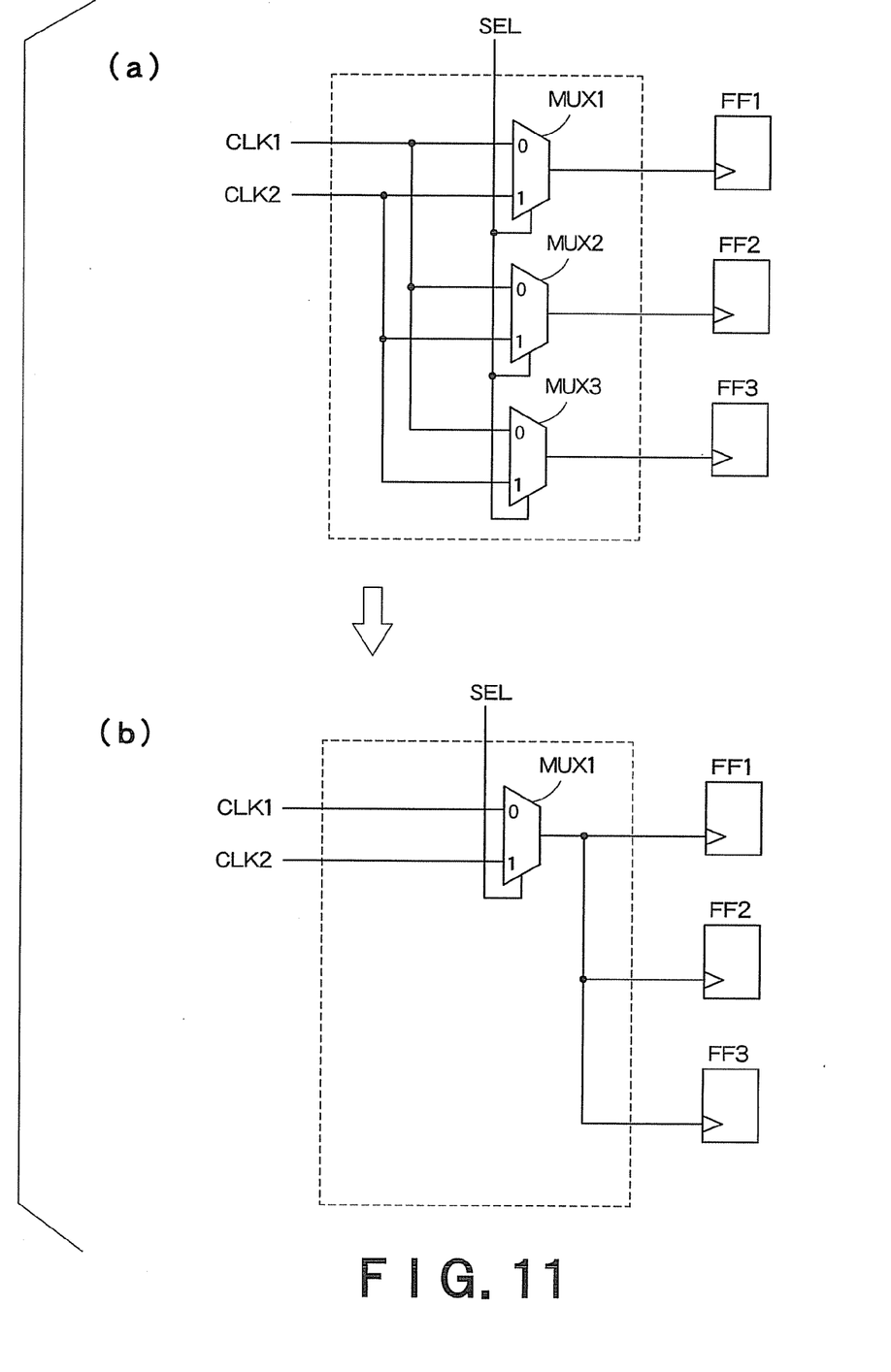
FIG. 11 illustrates an example of optimizing a clock control circuit.

With the designing method described above, redundant circuits contained in a clock control circuit can be removed for optimization. For example, the clock control circuit shown in FIG. 11(*a*) can be optimized as shown in FIG. 11(*b*).

In optimizing the clock control circuit, the region where the circuit structure is not desired to be changed may be designated in advance by the user (circuit designer) as a region not targeted for optimization.

Thus, clock signals to be propagated to the goal (leaf) of the clocks can be extracted without the analysis of the circuit structure of the clock control circuit, whereby the functions of the entire clock control circuit can be grasped in a short time.

Further, the clock control circuit can be reproduced using the clock select logic table to thereby remove redundant circuits. As a result, the clock control circuit can be optimized by, for example, reducing the chip area and the clock latency.

The designing apparatus for a semiconductor integrated circuit in each of the above embodiments can be realized by permitting a processor to execute the program, which processor is incorporated in a generally used computer system. In particular, the designing apparatus may be realized by installing the program in advance in the computer system, or by storing the program in a storage medium, such as a CD-ROM, or by distributing the program through a network to have the program adequately installed in the computer system.

What is claimed is:

1. A circuit designing method for a semiconductor integrated circuit, the circuit having a clock control circuit and leaves to which clock signals are propagated through the clock control circuit, comprising:

detecting a clock signal producing point where a clock signal is to be produced and an operational mode setting point where an operational mode setting signal for setting an operational mode is to be imparted, using a netlist and a cell library;

setting a clock signal and a name of the clock signal at the clock signal producing point;

setting an operational mode setting signal suitable for a desired operational mode at the operational mode setting point;

propagating the clock signal and the operational mode setting signal; and extracting, using a computer, signals being propagated to the leaves.

2. The circuit designing method according to claim 1, wherein the method further comprises:
   detecting a constant producing point where a constant is to be produced, using the netlist and the cell library;
   setting the constant at the constant producing point; and
   propagating the constant together with the clock signal and the operational mode setting signal.

3. The circuit designing method according to claim 1, wherein the method further comprises preparing a propagation clock table after extracting signals being propagated to the leaves, the propagation clock table indicating, for each of the operational modes, names or values of signals being propagated to respective leaves.

4. The circuit designing method according to claim 1, wherein the method further comprises preparing a clock select logic table after extracting signals being propagated to the leaves, the clock select logic table grouping signals together, which are propagated to the same leaf in all of the operational modes, and indicating, for each of the operational modes, names or values of signals being propagated to respective groups.

5. The circuit designing method according to claim 4, wherein the method further comprises:
   mapping a multiplexer corresponding to each of the groups, using the clock select logic table;
   establishing connection so that the operational mode setting signals can be imparted to a selection signal input terminal of the multiplexer; and
   establishing connection so that clock signals or signal values can be supplied to the multiplexer corresponding to each of the groups to produce a modified clock control circuit whose logic is equivalent to that of the clock control circuit.

6. The circuit designing method according to claim 5, wherein the method further comprises replacing the clock control circuit with the modified clock control circuit to prepare a netlist for the semiconductor integrated circuit having the modified clock control circuit.

7. The circuit designing method according to claim 5, wherein the method further comprises:
   referring to the clock select logic table; detecting a presence of a group to which a signal inverse of the clock signal has been propagated;
   mapping an inverter in a case where such a group to which a signal inverse of the clock signal has been propagated, is present; and establishing connection so that an output of the inverter can be imparted to the group.

8. The circuit designing method according to claim 7, wherein the method further comprises replacing the clock control circuit with the modified clock control circuit to prepare a netlist for the semiconductor integrated circuit having the modified clock control circuit.

9. A circuit designing apparatus for a semiconductor integrated circuit, the circuit having a clock control circuit and leaves to which clock signals are propagated through the clock control circuit, comprising:
   a data inputting section configured to be imparted with a netlist and a cell library;
   a clock/operational mode setting section configured to: detect a clock signal producing point where a clock signal is to be produced and an operational mode setting point where an operational mode setting signal for setting an operational mode is to be imparted, using the netlist and the cell library; set a clock signal and a name of the clock signal at the clock signal producing point; and set an operational mode setting signal suitable for a desired operational mode at the operational mode setting point;
   a clock propagation executing section configured to propagate the clock signal and the operational mode setting signal; and
   a propagated clock extracting section configured to extract signals being propagated to the leaves.

10. The circuit designing apparatus according to claim 9, wherein
   the clock/operational mode setting section is further configured to detect a constant producing point where a constant is to be produced, using the netlist and the cell library to set the constant at the constant producing point; and
   the clock propagation executing section is further configured to propagate the constant together with the clock signal and the operational mode setting signal.

11. The circuit designing apparatus according to claim 9, wherein the apparatus further comprises a clock table preparing section configured to prepare a propagation clock table indicating, for each of the operational modes, names or values of signals being propagated to respective leaves, based on the signals extracted by the propagation clock extracting section.

12. The circuit designing apparatus according to claim 9, wherein the apparatus further comprises:
   a leaf grouping section configured to group signals together, which are propagated to the same leaf in all of the operational modes, based on the signals extracted by the propagation clock extracting section; and
   a clock table preparing section configured to prepare a clock select logic table for indicating, for each of the operational modes, names or values of signals being propagated to respective groups.

13. The circuit designing apparatus according to claim 12, wherein the apparatus further comprises a circuit diagram preparing section configured to: map a multiplexer corresponding to each of the groups, referring to the clock select logic table; establish connection so that the operational mode setting signals can be imparted to a selection signal input terminal of the multiplexer; and establish connection so that clock signals or signal values can be supplied to the multiplexer corresponding to each of the groups to produce a modified clock control circuit whose logic is equivalent to that of the clock control circuit.

14. The circuit designing apparatus according to claim 13, wherein the apparatus further comprises a netlist preparing section configured to replace the clock control circuit with the modified clock control circuit to prepare a netlist for the semiconductor integrated circuit having the modified clock control circuit.

15. The circuit designing apparatus according to claim 13, wherein the circuit diagram preparing section is further configured to:
   refer to the clock select logic table;
   detect a presence of a group to which a signal inverse of the clock signal has been propagated;
   map an inverter in a case where such a group to which a signal inverse of the clock signal has been propagated, is present; and
   establish connection so that an output of the inverter can be imparted to the group.

16. The circuit designing apparatus according to claim 15 wherein the apparatus further comprises a netlist preparing section configured to replace the clock control circuit with the modified clock control circuit to prepare a netlist for the semiconductor integrated circuit having the modified clock control circuit.

17. A non-transitory computer readable medium, embedded thereon a computer program, which when executed by a computer, causes the computer to execute designing of a semiconductor integrated circuit, the circuit having a clock control circuit and leaves to which clock signals are propagated through the clock control circuit, the program allowing the computer to execute:
   detecting a clock signal producing point where a clock signal is to be produced and an operational mode setting point where an operational mode setting signal for setting an operational mode is to be imparted, using a netlist and a cell library;
   setting a clock signal and a name of the clock signal at the clock signal producing point;
   setting an operational mode setting signal suitable for a desired operational mode at the operational mode setting point;
   propagating the clock signal and the operational mode setting signal; and
   extracting signals being propagated to the leaves.

18. The non-transitory computer readable medium according to claim 17, wherein the program further allows a computer to execute preparing a propagation clock table after extracting signals being propagated to the leaves, the propagation clock table indicating, for each of the operational modes, names or values of signals being propagated to respective leaves.

19. The non-transitory computer readable medium according to claim 17, wherein the program further allows a computer to execute preparing a clock select logic table after extracting signals being propagated to the leaves, the clock select logic table grouping signals together, which are propagated to the same leaf in all of the operational modes, and indicating, for each of the operational modes, names or values of signals being propagated to respective the groups.

20. The non-transitory computer readable medium according to claim 19, wherein the program further allows a computer to execute: mapping a multiplexer corresponding to each of the groups, using the clock select logic table; establishing connection so that the operational mode setting signals can be imparted to a selection signal input terminal of the multiplexer; and establishing connection so that clock signals or signal values can be supplied to the multiplexer corresponding to each of the groups to produce a modified clock control circuit whose logic is equivalent to that of the clock control circuit.

* * * * *